INVENTORS
EDWIN F. KULIKOWSKI
ROBERT T. FITZGERALD
JOHN M. MILES
BY
D. C. Snyder
Edward White
ATTORNEYS May 8, 1956 E. F. KULIKOWSKI ET AL 2,745,016

AUTOMATIC TUNING MECHANISM

Filed March 25, 1952 2 Sheets-Sheet 2

INVENTORS
EDWIN F. KULIKOWSKY
ROBERT T. FITZGERALD
JOHN M. MILES

BY

D. C. Snyder
Howard White
ATTORNEYS 2,745,016
Patented May 8, 1956

2,745,016

AUTOMATIC TUNING MECHANISM

Edwin F. Kulikowski, University Park, John M. Miles, Hillcrest Heights, and Robert T. Fitzgerald, Rockville, Md.

Application March 25, 1952, Serial No. 278,512

4 Claims. (Cl. 250—40)

(Granted under Title 35, U. S. Code (1952), sec. 266)

This invention relates to automatic tuning systems for radio receivers, and particularly to a system for controlling and driving the tuning unit of a monitoring receiver to explore a given portion of the radio frequency spectrum, the system being so designed that the speed of scanning of the frequency band is appreciably reduced during the period when a carrier wave is encountered.

This application forms a continuation-in-part of applicant's copending application No. 631,763 filed Nov. 29, 1945 for Automatic Tuning Mechanism.

In receivers employed to continuously monitor a given portion of the radio frequency spectrum, tuning is effected by power means adapted to drive the tuning condensers in a receiver continuously back and forth through a given band of frequencies to monitor the carrier waves present within that band. One of the disadvantages of this method is that the rate at which the receiver is tuned through the band is constant, so that if rapid scanning is desired, the time during which the receiver is tuned to any given transmitter signal is too short to enable the operator to learn anything about the character of the signal. One of the operational methods employed to overcome this disadvantage is to employ an automatic tuning device to drive the tuning condensers at a uniform speed back and forth across the frequency band until a signal is heard, at which time the automatic tuning device is stopped long enough to examine the receiver signal. This method, however, greatly increases the time required to scan the frequency band. It is one of the purposes of this invention to provide means for reducing the total scanning time by automatically effecting rapid scanning of the frequencies between received carrier signals and slow scanning when tuned to the carrier frequencies.

Accordingly, one object of this invention is to provide improved tuning means for a radio receiver of this type.

Another object of this invention is to provide automatic tuning means for a radio receiver, whereby the receiver is rapidly tuned through the frequencies between carrier waves or signals and slowly tuned through the carrier frequencies.

Another object of this invention is to provide automatic tuning means for a radio receiver whereby an increased ratio of listening time to tuning time is obtained.

Other objects, advantages and capabilities of the invention will appear from the following description, taken in conjunction with the figures in the accompanying drawings, and in the appended claims in which the various novel features of the invention are more particularly set forth.

Referring now to the drawings wherein a preferred embodiment of the novel device is shown:

Briefly the invention comprises an automatic tuning system for a radio receiver. The system has two electric motors, a differential gear mechanism having an output shaft coupled to the tuning element of the radio receiver, a pair of input shafts coupling each of the electric motors to the differential gear mechanism and a control circuit being fed from the band pass filter of the radio receiver to control the energization of one of the electric motors by rendering the motor operative only when a carrier signal is present in the receiver.

Figure 1:
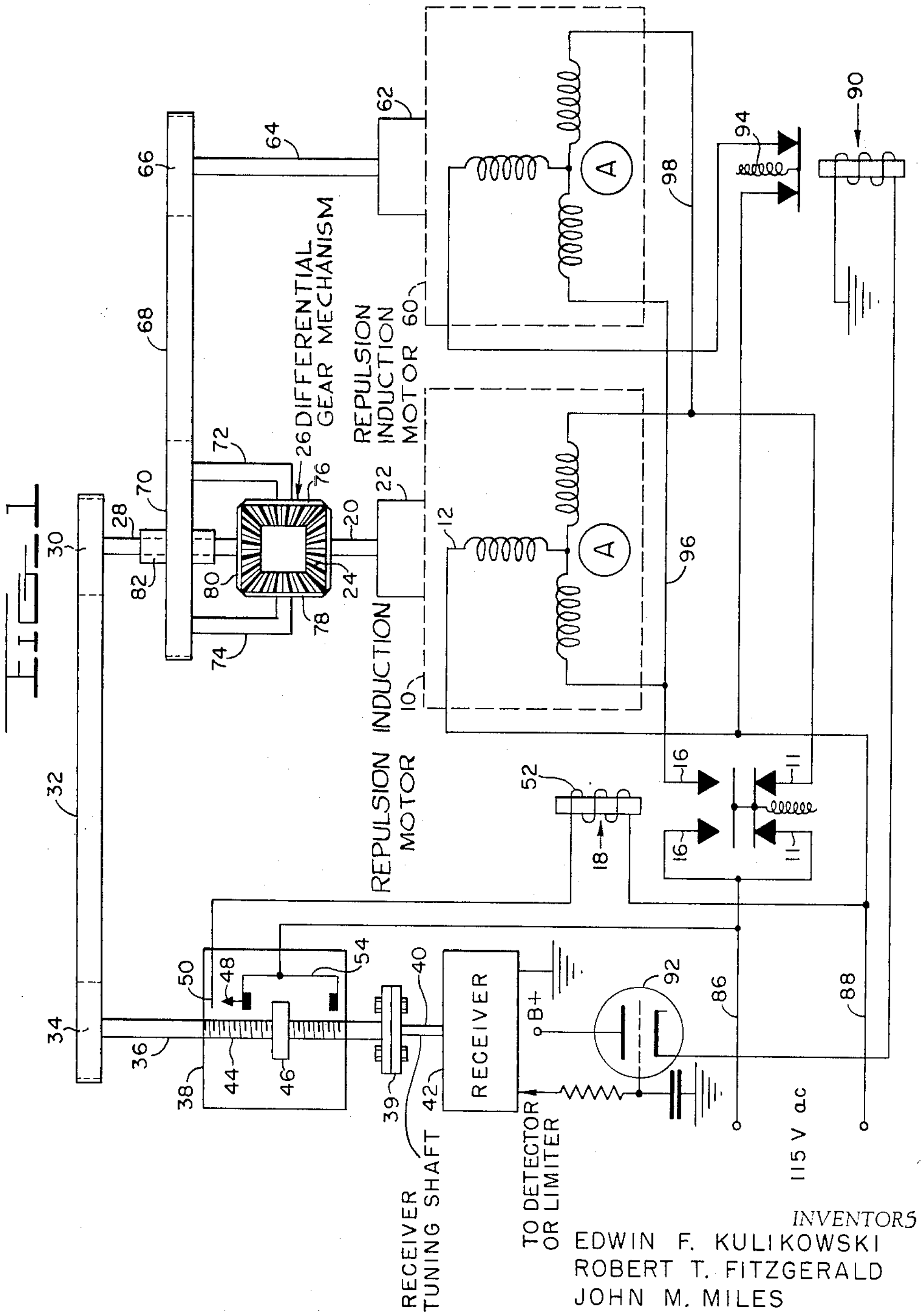
Figure 1 is a schematic diagram, partly in block form, of the novel tuning mechanism.

Referring now to Fig. 1 of the drawing, a conventional repulsion-induction motor 10 is continuously driven by an A. C. voltage, one phase winding of which is supplied through contacts 11 and lead 12 and the other phase winding through contacts 16 and lead 12 of a motor reversing relay 18. The shaft 20 which is integrally attached to differential gear 24 is mechanically coupled to the motor 10 through reduction gears 22. From the differential gear system 26, the motion of shaft 20 is transmitted through shaft 28 to pulley 30. This action is described in detail below. From the pulley 30, the motion is transmitted through belt 32 and pulley 34 to shaft 36. Shaft 36 controls the operation of motor reversing switch 38 and is mechanically coupled by fitting 39 to the tuning shaft 40 of a monitoring receiver 42. The reversing switch 38 is a shaft-driven geared-type of switch which is designed for direct connection to the shaft of a motor or other driven member and for opening or closing contacts at the limits of travel in both directions to control the energizing and deenergizing of the motor reversing relay 18. Switch 38 is activated by screw 44 which is an integral part of shaft 36. Screw 44 is rotated by the shaft 36 in accordance with the direction of rotation of the pulley 34 to which the shaft 36 is integrally attached. As the screw 44 is rotated, a traveller 46 proceeds up and down in accordance with the direction of rotation of screw 44. As the traveller 46 proceeds to its upper limit, contact 48 is forced into electrical contact with the arm 50 by fork 54 to thereby energize coil 52 of the motor reversing relay 18. As the motor reversing relay 18 becomes energized, motors 10 and 60, shown in Fig. 1, reverse in direction and accordingly screw 44 of switch 38 reverses in direction and the traveller 46 proceeds in an opposite direction. As the traveller 46 proceeds to its lower limit, electrical contact is broken between contact 48 and arm 50 by the traveller 46 contacting the lower arm of fork 54 thereby deenergizing coil 52 of relay 18 to again reverse the direction of the motors 10 and 60. Fork 54 of motor reversing relay 38 limits the lower extent of travel of the traveller 46 by controlling the direction of rotation of motors 10 and 60.

Figure 2:
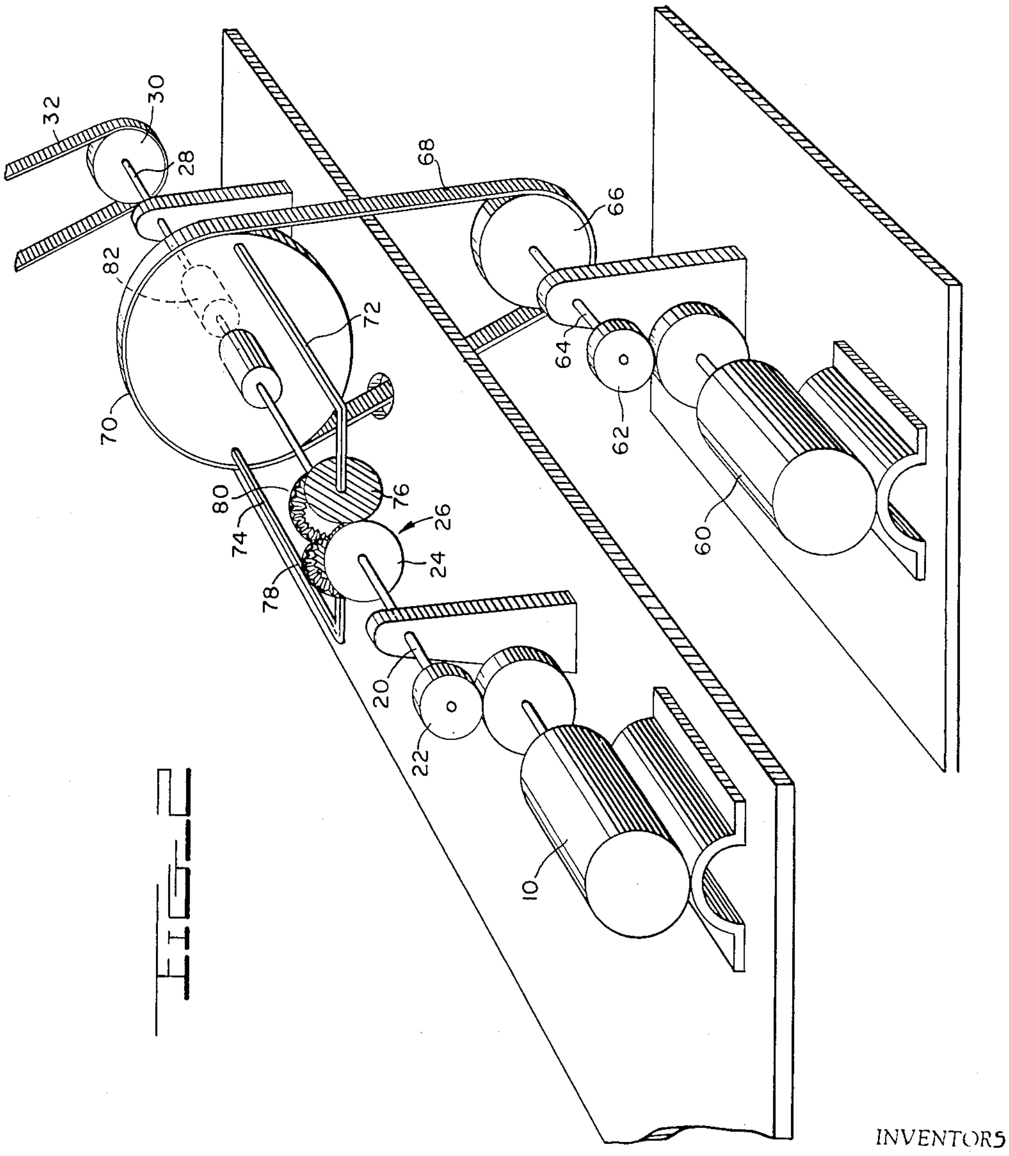
Figure 2 is a perspective view of the gearing arrangement of the novel tuning mechanism.

Also mechanically coupled to the differential gear system 26 is the repulsion-induction motor 60. This mechanical coupling is achieved as follows: A shaft 64 is coupled to the output of motor 60 through a reduction gearing 62. Shaft 64 is rigidly connected to the pulley 66 which in turn transmits the rotation of shaft 64 to the belt 68. Belt 68 turns pulley 70 which rigidly supports a pair of arms 72 and 74. Arm 72 has the differential gear 76 rotatably mounted on its unsupported end and arm 74 has the differential gear 78 rotatably mounted on its unsupported end so that as the pulley 70 is rotated by the belt 68 in a clockwise direction, the gears 76 and 78 will be bodily rotated in a clockwise direction about shaft 82. The other gear of differential gear system 26 is the gear 80 which is mounted on the end of shaft 28. As clearly shown in Fig. 2, shaft 28 passes through shaft 82 which is rigidly secured to the pulley 70. Shaft 82 also serves to rotatably mount pulley 70 in the support 84.

The operation of the differential gear system 26 is as follows: First assume that motor 10 is not turning. Then gear 24 which is rigidly connected to shaft 20 is stationary. Now should motor 60 turn, pulley 66 would be turned due to the rotation of shaft 64. Assuming that pulley 66 would turn clockwise, pulley 70 would also turn clockwise because of the belt 68. Rotation of pulley 70 would cause gears 76 and 78 to turn about the axis of shaft 28 because they are fixed on arms 72 and 74 which are attached to pulley 70. Further, gears 76 and 78 will rotate with respect to the axis of the pulley 70, and because they mesh with gear 20 which is stationary since motor 10 is not rotating, they must also turn in opposite directions on their own axles. The teeth of gears 76 and 78 will then turn the gear 80 with twice the speed of their axles thereby causing gear 80 to rotate with twice the angular speed of the pulley 70. Then if $S_{24}$, $S_{80}$, $S_{76}$, $S_{78}$ represent the angular speed of gear 24, pulley 70, gear 80, gear 76, and gear 78, respectively $$S_{80}=2S_{70}$$

Now assume that motor 60 is not turning and therefore pulley 70 is stationary. When the motor 10 turns clockwise, it will cause gear 24 to turn clockwise. Gear 24 will rotate gears 76 and 78 on their axles, i. e., on arms 72 and 74, but cannot rotate the arms 72 and 74 about the axis of the pulley 70 because motor 60 acts as a brake. Gears 76 and 78 will cause gear 80 to rotate at the same speed as gear 24 but in a counterclockwise direction. In this case $$S_{80}=-S_{24}$$

Thus, it can be seen that the angular speed of gear 80 can be expressed by the following equation.

$$S_{80}=2S_{70}-S_{24}$$

where a negative sign indicates a reverse direction of rotation with respect to a positive rotation.

Suppose now that it were desirable in the absence of a carrier wave or signal to operate gear 80 and therefore shaft 36 at 12.0 R. P. M. from motor 10 and to operate shaft 36 and gear 80 at 1.2 R. P. M. when a carrier wave or signal is present. When the tuning is at 12 R. P. M., motor 10 and its reduction gears 22 would cause shaft 20 and gear 24 to rotate at 12 R. P. M. At this time, pulley 70 would be stationary since motor 60 is not turning and gear 80 would be driven at 12 R. P. M. but in a different direction from gear 24. Gear 80 would rotate shaft 36 at 12 R. P. M. through shaft 28, pulley 30, belt 32, and pulley 34. Shaft 36 would move the traveler 46 and tune the tuning control of receiver 42 at 12 R. P. M.

In order to reduce the speed in the presence of a received signal, a relay 90 and control tube 92 are provided to energize motor 60 for the duration of the received signal. Tube 92 as shown in Fig. 1 is a triode. Its anode is connected directly to B+ which may be the B+ supply in receiver 42. Its control grid is connected through a suitable resistance-capacitance filter to the second detector of the receiver for AM, or if the receiver is for FM— to the grid of the limiter. This connection is made to provide at the grid of tube 92 a negative voltage proportional to signal amplitude. It will be obvious that if the receiver is the type having AVC the grid may be directly connected to the receiver AVC bus. The cathode is returned to ground through the coil of relay 90. When no signal is received there is no negative bias on tube 92 and its heavy plate current energizes relay 90 to deenergize motor 60. When a signal appears at receiver 42, the negative voltage produced in the AVC portions of the receiver is supplied to the control grid of tube 92. The resulting reduction in plate current releases relay 90, under the action of spring 94 to start motor 60. Now by the proper selection of the diameters of the pulleys 66 and 70, gear 80 may be driven to have an angular speed of 1.2 R. P. M. By using a one to one coupling between gear 80 and shaft 36, shaft 36 will rotate the tuning control of receiver 42 at one-tenth the angular speed or at 1.2 R. P. M. in the presence of a carrier wave or signal.

It should also be noted that the two phasing leads 96 and 98 of the motor 60 are connected to the same leads on motor 10 so that the direction of rotation of both motors will always be the same, and further that the reversing action cannot alter the speed relationship of the motors.

As the receiver 42 is tuned above or below the carrier wave signal the negative signal supplied to control tube 92 is decreased and the plate current drawn thereby increased, thus closing relay 90 against the action of spring 94 to stop motor 60 and cause shaft 36 to resume an angular speed of 12 R. P. M.

When the receiver 42 has been tuned across the preselected frequency band to one of its preset limits, the motor reversing switch 38 makes or breaks contact with the A. C. line 86 and 88, as previously explained, to energize or deenergize the coil 52 of the motor reversing relay 18, depending upon its condition immediately preceding the limit position, thus shifting the position of the relay contacts and causing the current to flow to a different winding of motor 10. The shaft of motor 10 reverses in direction and sweeps the tuning of receiver 42 back through the frequency band in the same manner as that described in the forward cycle.

It will be apparent from the above description that a device has been provided for use with monitoring receivers giving a wide variety of choices of listening time to scanning time ratio depending upon the ratio of reduction gears chosen, i. e., the relative speed of output shafts 20 and 64, thus enabling the receiver 42 to effectively monitor a given band of frequencies at a rapid scanning rate.

Various modifications may be made in the invention without departing from the scope and spirit thereof, and it is desired, therefore, that only such limitations shall be placed thereon as are imposed by the prior art and are set forth in the appended claims.

The invention described herein may be manufactured and used by or for the Government of the United States of America for governmental purposes without the payment of any royalties thereon or therefor.

What is claimed is:

1. In an automatic tuning system for a radio receiver, means for tuning said receiver back and forth through a given frequency band comprising first and second reversible direction electric motors, said first motor being continuously operated, a differential gear mechanism having an output shaft connected to the tuning element of said receiver and a pair of input shafts connected respectively to the output shafts of said motors to change the rotation rate of the receiver tuning element when said second motor is energized, reversing switch means connected to said motors to effect a reversal in the direction of rotation thereof, and a second switch means connected to said second motor to control the energization thereof, and means responsive to the reception of a signal by said receiver to actuate said second switch means.

2. In an automatic tuning system for a radio receiver, the combination set forth in claim 1 wherein said reversing switch means comprises a limit switch coupled to the output of said differential and to a relay having reversing contacts in the field winding supply leads of each of said motors, whereby said limit switch is actuated at predetermined limits of rotation of the output of said differential to control said relay contacts to reverse the direction of current flow in the field windings of said motors.

3. In an automatic tuning system for a radio receiver, the combination set forth in claim 1 wherein said second switch means comprises a relay, a switch tube coupled to a signal circuit in said receiver and in series with the coil of said relay, said relay having a contact in the field winding supply lead of said second motor, whereby said switch tube is actuated by the presence of a carrier signal in said receiver to control said relay contact to energize said second motor only for the period when said receiver is tuned to the frequency of said carrier signal.

4. In an automatic tuning system for a radio receiver, means for tuning said receiver back and forth through a given frequency band comprising first and second reversible direction electric motors, said first motor being continuously operated, a differential gear mechanism having an output shaft connected to the tuning means of said receiver and a pair of input shafts connected respectively to the output shafts of said motors, said input shafts and said output shaft being so geared to change the variation rate of said tuning means in said receiver when said second motor is energized, reversing switch means connected to said motors to effect a reversal in the direction of rotation thereof, a second switch means connected to said second motor to control the energization thereof, and means responsive to the reception of a signal by said receiver to actuate said second switch means.

References Cited in the file of this patent

UNITED STATES PATENTS

| | | |
|---|---|---|
| 1,500,860 | Yo | July 8, 1924 |
| 1,883,163 | Voorhis | Oct. 18, 1932 |
| 2,207,467 | Muller | July 9, 1940 |
| 2,326,738 | Andrews | Aug. 17, 1943 |
| 2,411,147 | Cooley | Nov. 19, 1946 |
| 2,453,252 | Newman | Nov. 9, 1948 |